United States Patent
Kobayashi

(10) Patent No.: US 7,595,224 B2
(45) Date of Patent: Sep. 29, 2009

(54) METHOD FOR MANUFACTURING INTEGRATED CIRCUIT

(75) Inventor: Nobuji Kobayashi, Anpachi-Gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 459 days.

(21) Appl. No.: 11/707,866

(22) Filed: Feb. 20, 2007

(65) Prior Publication Data

US 2007/0202629 A1 Aug. 30, 2007

(30) Foreign Application Priority Data

Feb. 28, 2006 (JP) .............................. 2006-052248

(51) Int. Cl.
  *H01L 21/44* (2006.01)
  *H01L 21/48* (2006.01)
  *H01L 21/50* (2006.01)
  *H01L 21/336* (2006.01)
  *H01L 21/76* (2006.01)

(52) U.S. Cl. .................. 438/110; 438/424; 438/296; 438/435

(58) Field of Classification Search ................ 438/110, 438/60, 72, 424, 425, 426, 427, 429, 430, 438/443, 435, 437, 439, 294–297
See application file for complete search history.

(56) References Cited

U.S. PATENT DOCUMENTS

| 5,766,971 A | * | 6/1998 | Ahlgren et al. | ............. | 438/296 |
| 5,976,948 A | * | 11/1999 | Werner et al. | ................ | 438/424 |
| 6,177,331 B1 | * | 1/2001 | Koga | .......................... | 438/424 |
| 2005/0287763 A1 | * | 12/2005 | Kim et al. | ................... | 438/424 |

* cited by examiner

*Primary Examiner*—Chuong A. Luu
(74) *Attorney, Agent, or Firm*—Oliff & Berridge, PLC

(57) ABSTRACT

In a method for manufacturing a light detector that is provided with an apertured part for incident light on an upper structural layer stack laminated on a semiconductor substrate, a polyimide film, which is applied in order to protect a silicon-nitride film on an upper surface of the upper structural layer stack, is properly removed from the apertured part, allowing, e.g., the intensity of light incident within the apertured part to be made uniform. A smoothing film 140 is applied to the surface of the upper structural layer stack 86, smoothly covering corner parts 142 on the aperture edge of the apertured part 116. The smoothing film 140 is etched and the corner parts 142 that are exposed on the aperture edge, where the smoothing film 140 is thin, are removed by the etching. The aperture edge of the apertured part 116 is thereby enlarged. After the smoothing film 140 has been detached, a polyimide film is applied. The polyimide film can be prevented from remaining too thick within the apertured part 116 and can be easily removed therefrom due to the enlargement of the aperture edge.

6 Claims, 6 Drawing Sheets (Related Art)

METHOD FOR MANUFACTURING INTEGRATED CIRCUIT

CROSS-REFERENCE TO RELATED APPLICATION

The priority application number JP2006-052248 upon which this patent application is based is hereby incorporated by the reference.

FIELD OF THE INVENTION

The present invention relates to a manufacturing method for forming an integrated circuit on a semiconductor substrate or the like, and in particular relates to a method for forming a protective layer on an upper structural layer stack, in which the structure has an apertured part on an upper structural layer stack consisting of an interlayer insulating film or the like that is laminated on the substrate.

BACKGROUND OF THE INVENTION

In recent years, optical disks such as CDs (compact disks) and DVDs (digital versatile disks) have come to occupy an important position as information recording media. In devices for reading these optical disks, laser light is emitted along tracks on the optical disk, and the light reflected is detected by an optical pickup mechanism. Recorded data is then read based on changes in the intensity of the reflected light.

Since the data rate for reading from optical disks is extremely high, the light detector for detecting the reflected light is composed of a semiconductor device that uses a PIN photodiode having a high response rate. The weak photoelectric conversion signal generated by the light-receiving part of the semiconductor device is amplified by an amplifier and then output to a subsequent signal-processing circuit. The length of wiring between the light-receiving part and the amplifier is therefore reduced as much as possible in order to maintain the frequency characteristics of the photoelectric conversion signal and to minimize the superposition of noise. The light-receiving part and the circuit part, including the amplifier and the like, are preferably formed on the same semiconductor chip because of these issues and also from the standpoint of reducing the cost of manufacturing the light detector.

FIG. 1 is a schematic cross-sectional view of the vicinity of a light-receiving part of a light detector in which the light-receiving part and the circuit part are positioned adjoining one another on the same semiconductor substrate. The structure of a PIN photodiode (PD) 8 is formed on a semiconductor substrate 2 in a region that corresponds to a light-receiving part 4. Transistors and other circuit elements are formed in a region corresponding to a circuit part 6.

The light detector of FIG. 1 has a two-layer wiring structure. An interlayer insulating film 12, wiring layers 14 and a light-blocking layer 16 that are both composed of aluminum (Al) films, a silicon-oxide film 18, and a silicon-nitride film 20 are layered on the semiconductor substrate 2 as an upper structural layer stack 10. The interlayer insulating film 12 is formed using SOG (spin on glass), BPSG (borophosphosilicate glass), or TEOS (tetra-ethoxy-silane). The silicon-nitride film 20 and the silicon-oxide film 18 together constitute a protective layer for the under layer thereof. The region on the upper structural layer stack 10 that corresponds to the light-receiving part 4 is etched back and an apertured part 30 is formed in that region in order to increase the efficiency of light incidence on the PIN photodiode 8.

A polyimide is further deposited on the upper structural layer stack 10, forming a polyimide film 32. The polyimide film 32 functions as a protective layer for the silicon-nitride film 20. Providing the polyimide film 32 allows the occurrence of cracks on the silicon-nitride film 20 to be minimized, for example, and the moisture resistance to be improved.

FIGS. 2A through 2C are schematic diagrams for describing a conventional method for manufacturing the light detector shown in FIG. 1, showing schematic views of the major steps. The upper structural layer stack 10 is laminated on the semiconductor substrate 2, on which are formed the PD 8 and the like, and the apertured part 30 is formed on the portion that corresponds to the light-receiving part 4 (FIG. 2A).

Once the apertured part 30 has been formed, a polyimide is applied by spin coating, forming a polyimide film 40 (FIG. 2B).

A photoresistive film is applied/formed on the polyimide film 40. The photoresistive film is patterned by photolithography, forming a photoresistive film 42 that covers the circuit part 6 and forms an aperture on the region that corresponds to the light-receiving part 4 (FIG. 2C).

The photoresistive film 42 is then used as an etching mask to etch the polyimide film 40, removing the portion within the apertured part 30. The polyimide film 32 is thereby formed covering the upper surface of the upper structural layer stack 10. The photoresistive film 42 is then removed, whereby the structure shown in FIG. 1 is obtained.

The polyimide film 40 is an organic film, as is the photoresistive film 42. The photoresistive film 42 is therefore also easily etched when the polyimide film 40 is dry etched. Wet etching is therefore preferably used to remove the polyimide film 40 from the apertured part 30.

Problems have been presented in this etching step in that striations and residue from the polyimide film 40 readily arise in the apertured part 30. FIG. 3 is a schematic cross-sectional view that shows the state of the polyimide film 40 after etching. As shown in FIG. 3, for example, a polyimide residue 44 may form in the corners at the bottom of the apertured part 30. In particular, the more the aspect ratio of the apertured part 30 increases; i.e., the more the ratio of depth of the apertured part 30 increases with respect to the width, the more thickly the polyimide film 40 will embed the apertured part 30 and the more prominent the aforementioned problems may become. Polyimide striations and residue within the apertured part 30 have caused problems in light detectors provided with the apertured part 30 that corresponds to the light-receiving part 4 in that inconsistencies occur in the intensity of light incident on the PD 8.

Depending on the characteristics of the surface-covering film, the apertured part may be buried too thickly when the surface-covering film is formed on the upper surface of the upper structural layer stack, which is laminated on a substrate and provided with an apertured part, and thus the usable etching methods are limited. Problems have therefore been presented in that it may be difficult to properly remove the surface-covering film from the apertured part and to selectively form the surface-covering film on the upper surface of the upper structural layer stack.

On the other hand, if the thickness of the applied polyimide or other surface-covering film is too thin, residues and the like may not readily form within the apertured part, but problems will be presented in that the function needed for the surface-covering film; i.e., protecting the upper surface of the upper structural layer stack, will be difficult to maintain.

SUMMARY OF THE INVENTION

The present invention was devised in order to solve the foregoing problems, and provides a method for manufacturing an integrated circuit enabling a surface-covering film to be properly removed from an apertured part in which the surface-covering film was deposited after the apertured part has been formed.

The method for manufacturing an integrated circuit according to the present invention comprises: a step for forming an apertured part, in which an upper structural layer stack laminated on a substrate is etched to form the apertured part; a step for forming a smooth film, in which a smoothing film that decreases in thickness on a corner part of an aperture edge of the apertured part is deposited on a surface of the upper structural layer stack; a step for enlarging the aperture edge, in which the smoothing film and the upper structural layer stack are both subjected to erosive etching, the corner part that is exposed from the smoothing film is removed, and the aperture edge is expanded; a step for detaching the smoothing film, in which the smoothing film that remains from the etching treatment in the step for enlarging the aperture edge is detached; a step for covering the surface, in which a surface-covering film is applied to the surface of the upper structural layer stack after the step for detaching the smoothing film; a step for forming an etching mask, in which an etching mask is formed on the surface-covering film; and a step for etching the surface-covering film, in which the surface-covering film is etched using the etching mask and removed from the apertured part.

DESCRIPTION OF THE PREFERRED EMBODIMENTS

An embodiment of the present invention shall be described below with reference to the drawings.

The present embodiment is a light detector for mounting on a light-pickup mechanism of a device for reading optical disks such as CDs and DVDs.

Figure 1:
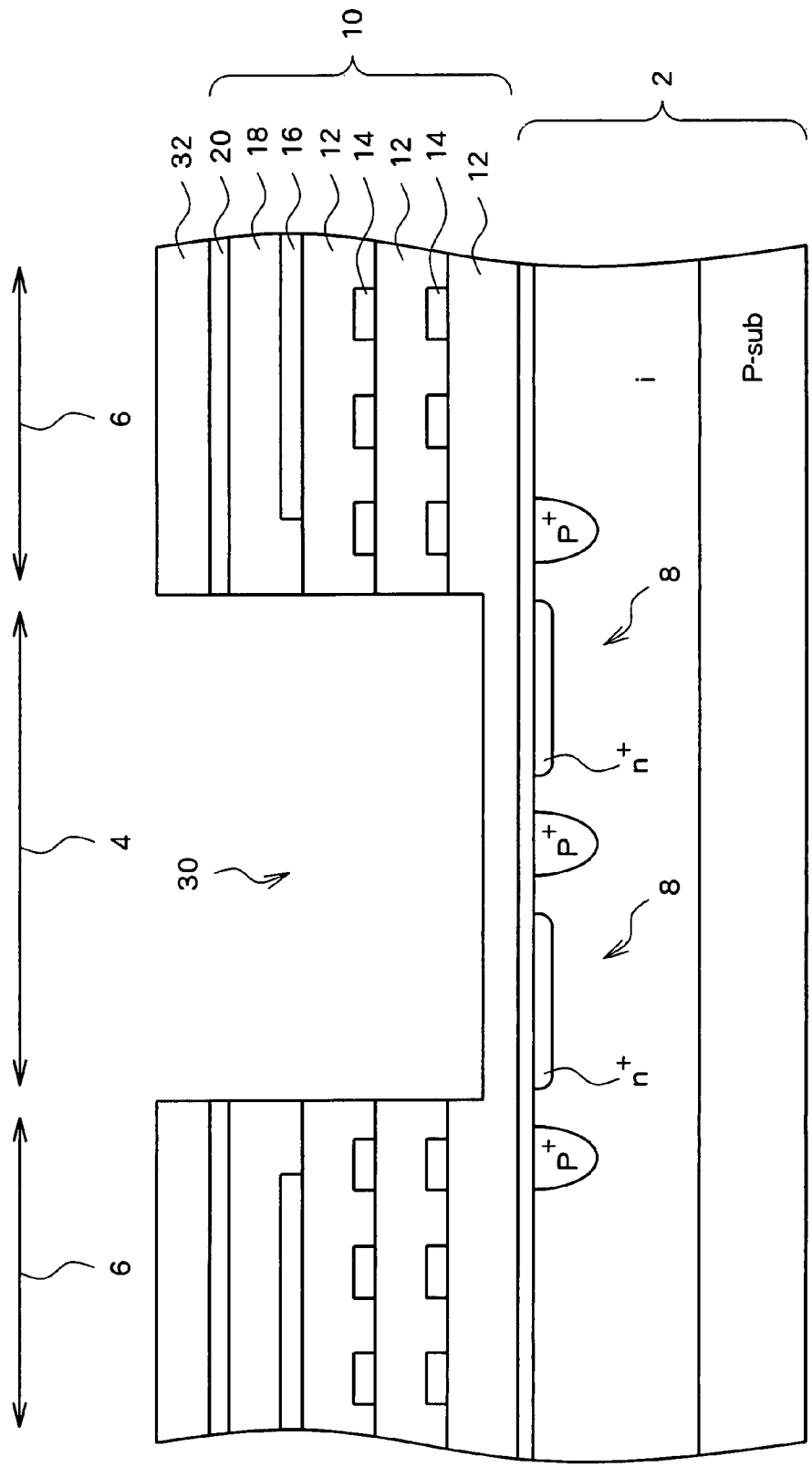
FIG. 1 is a schematic cross-sectional view of the vicinity of the light-receiving part of a light detector in which the light-receiving part and a circuit part are positioned adjacent to one another on the same semiconductor substrate.
Figure 2A:
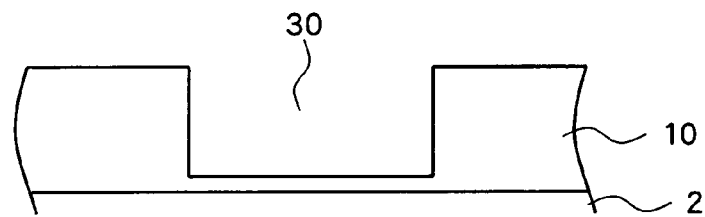
FIGS. 2A through 2C are schematic drawings showing cross-sectional structures during conventional steps for manufacturing the light detector shown in FIG. 1.
Figure 2B:
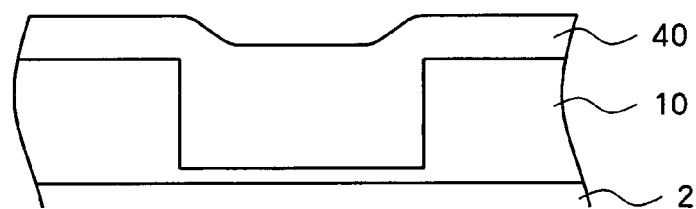
Figure 2C:
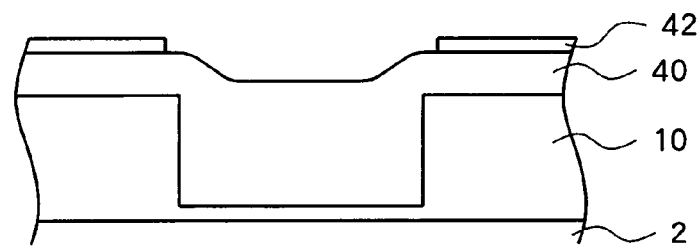
Figure 3:
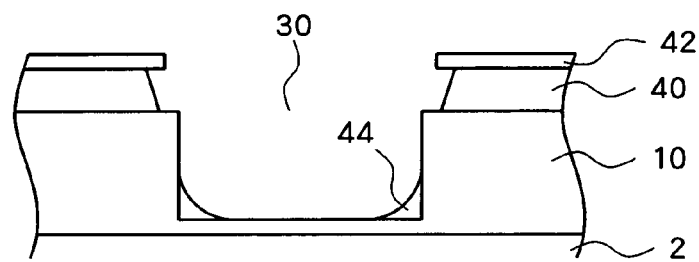
FIG. 3 is a schematic drawing that describes problems with the conventional method for manufacturing the light detector shown in FIG. 1.
Figure 4:
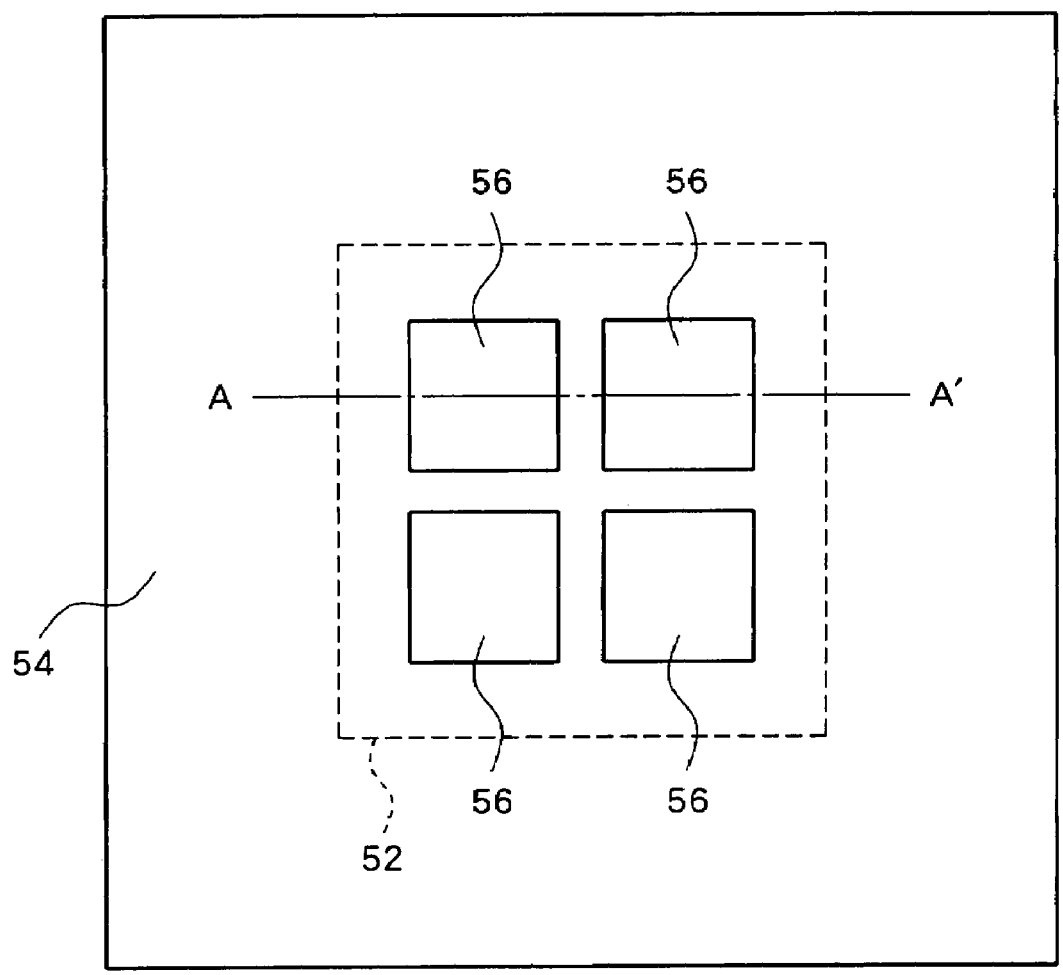
FIG. 4 is an abbreviated plan view of a semiconductor device that acts as a light detector according to an embodiment of the present invention.

FIG. 4 is an abbreviated plan view of a semiconductor device that acts as the light detector according to the present embodiment. This light detector 50 is formed on a silicon semiconductor substrate. The light detector 50 is composed of a light-receiving part 52 and a circuit part 54. The light-receiving part 52 comprises, e.g., four PIN photodiodes (PD) 56 in a 2×2 arrangement, and in four partitioned segments receives light incident on the surface of the substrate from an optical system. The circuit part 54 is positioned, e.g., around the light-receiving part 52. A transistor, for example, and other circuit elements are formed on the circuit part 54. A circuit for amplifying output signals from the light-receiving part 52 and other signal-processing circuits can be formed on the same semiconductor chip as the light-receiving part 52 using the circuit elements of the circuit part 54. Wiring connected to the circuit elements and wiring connected to a diffusion layer constituting the light-receiving part 52 are positioned on the circuit part 54 (this wiring is not shown in FIG. 4). This wiring is formed by patterning the Al film layered on the semiconductor substrate.

Figure 5:
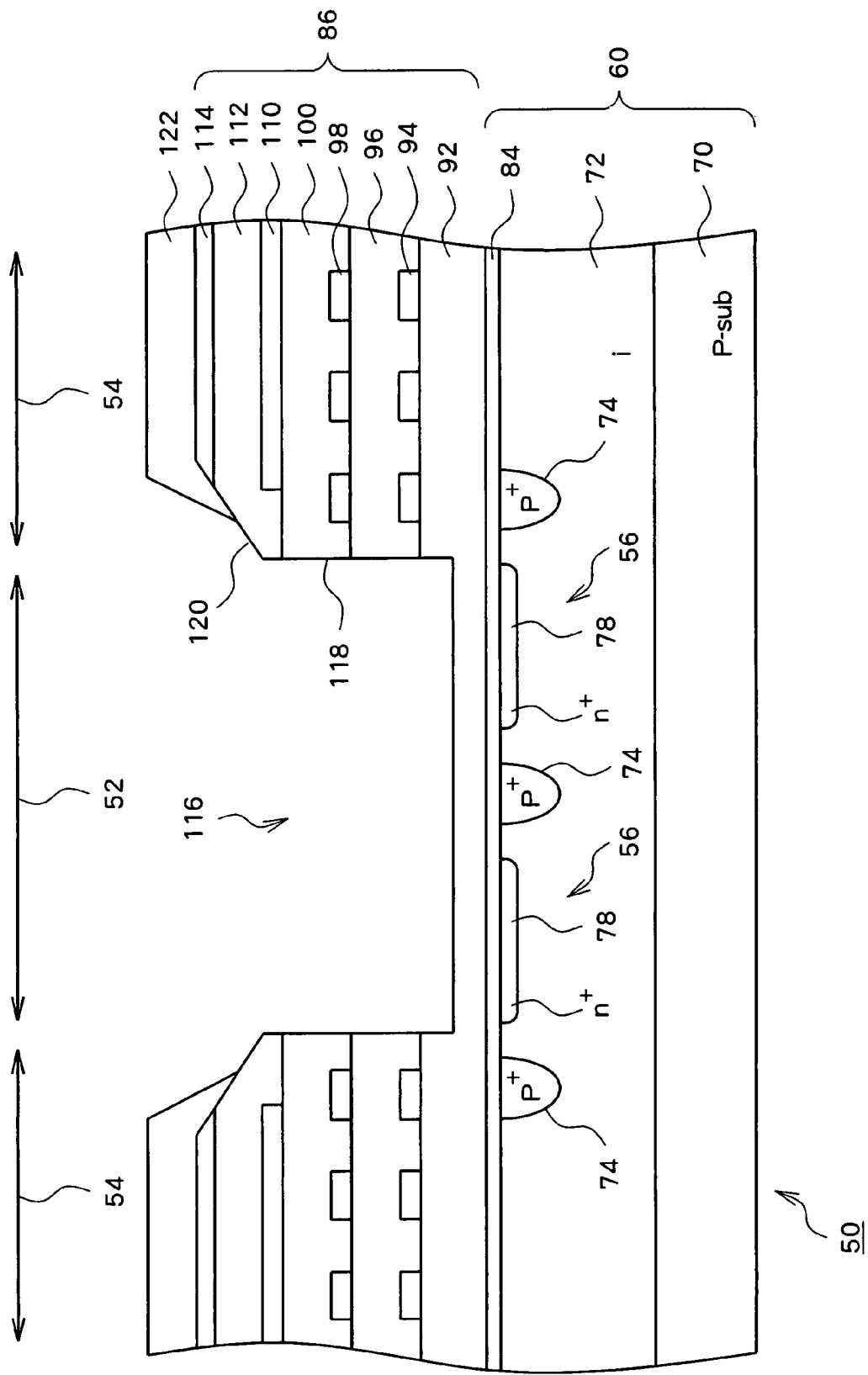
FIG. 5 is a schematic cross-sectional view showing the structure of the light-receiving part and the circuit part of the light detector that is an embodiment of the present invention.

FIG. 5 is a schematic cross-sectional view showing the structure of the light-receiving part 52 and the circuit part 54 in a cross section perpendicular to the semiconductor substrate along the straight line A-A' shown in FIG. 4.

The light detector 50 is produced using a semiconductor substrate 60, wherein an epitaxial layer 72 having a lower impurity concentration and a higher specific resistance than a P-sublayer 70 is built up on the P-sublayer 70, which is a p-type silicon substrate into which a p-type impurity has been introduced. The P-sublayer 70 constitutes a common anode for the PDs 56 and, for example, applies a grounding potential from a rear surface of the substrate. An isolated region 74 applies a grounding potential and constitutes a common anode with the P-sublayer 70.

In the light-receiving part 52, the epitaxial layer 72 constitutes an i layer of the PDs 56, and the aforedescribed isolated region 74 and a cathode region 78 are formed on the surface of the epitaxial layer 72.

A silicon-oxide film comprising a gate oxide film and a local oxide film (LOCOS) is formed on the surface of the semiconductor substrate 60. A gate electrode composed of a MOSFET or the like is formed on the gate oxide film using, e.g., polysilicon or tungsten (W). A silicon-oxide film 84 is formed on the surface of the substrate and covers the gate electrode.

An upper structural layer stack 86, which is composed of the wiring structure, the protective layer, and the like, is formed on the semiconductor substrate after the silicon-oxide film 84 has been formed. The wiring of the light detector 50 has a two-layer structure. A first interlayer insulating film 92, a first Al layer 94, a second interlayer insulating film 96, a second Al layer 98, and a third interlayer insulating film 100 are sequentially layered on the semiconductor substrate 60 as a wiring structure. The first Al layer 94 and second Al layer 98 are patterned using photolithography techniques, forming wiring on the circuit part 54. The interlayer insulating films are formed using SOG, BPSG, or TEOS.

An Al layer 110 for blocking light is layered on the wiring structure of the circuit part 54, and a silicon-oxide film 112 and a silicon-nitride film 114 are further layered sequentially thereon as a protective layer.

The upper structural layer stack 86 is etched and an apertured part 116 is formed in the region corresponding to the light-receiving part 52. The apertured part 116 is thus formed in the light-receiving part 52, whereby the transmittance of light to the PDs 56 is improved, and the amplitude of the photoelectric conversion signal can be maintained according to the reflected laser light.

The lower part of the apertured part 116 of the light detector 50 has a side wall 118 formed at an angle that is approximately perpendicular. The upper part of the apertured part 116 has a surface (flared surface 120) shaped to expand at the end facing the aperture edge. In a configuration in which the first Al layer 94 and the second Al layer 98 are positioned within the range from the bottom of the apertured part 116 to the height of the side wall 118 of the lower part, for example, the light-receiving part 52 may be positioned near the wiring, making it easy for the PDs 56 to be connected thereto.

A polyimide film 122 is layered on the upper surface of the upper structural layer stack 86. The polyimide film 122 covers the silicon-nitride film 114, relieving the stress thereon and minimizing the occurrence of cracking. The polyimide film 122 complements the moisture-proofing function of the silicon-nitride film 114 and improves the moisture resistance of the upper structural layer stack 86.

Figure 6A:
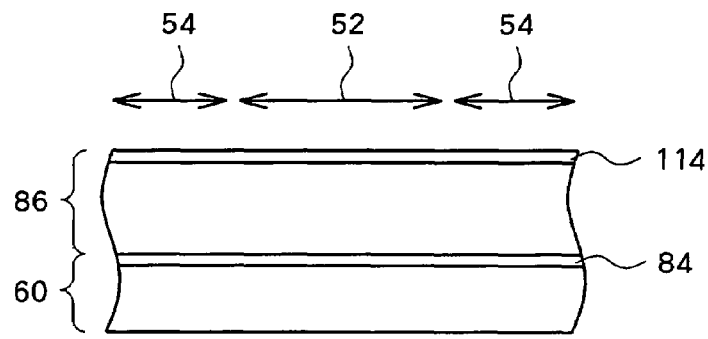
FIGS. 6A through 6E are schematic drawings showing cross-sectional structures during the major steps for manufacturing the light detector of an embodiment of the present invention.

FIGS. 6A through 6E and FIGS. 7A through 7D are schematic diagrams describing a method for manufacturing a light detector according to the present embodiment and show schematic cross-sectional views during the main steps. Once the PDs 56, the circuit elements, and the silicon-oxide film 84 have been formed on the semiconductor substrate 60, the layers that constitute the upper structural layer stack 86 are sequentially layered thereon (FIG. 6A). The layers that constitute the upper structural layer stack 86 may be deposited using CVD (chemical vapor deposition) or PVD (physical vapor deposition). The Al films on the upper structural layer stack 86 are patterned and removed from the light-receiving part 52.

Figure 6B:
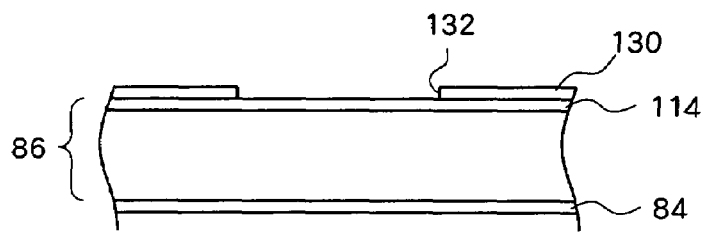

A photoresist is then applied by, e.g., spin coating to the silicon-nitride film 114 on the uppermost layer of the upper structural layer stack 86, forming a photoresistive film. The photoresistive film is patterned by photolithography, forming a photoresistive film 130 that has an aperture 132 at the location that corresponds to the light-receiving part 52 (FIG. 6B).

Figure 6C:
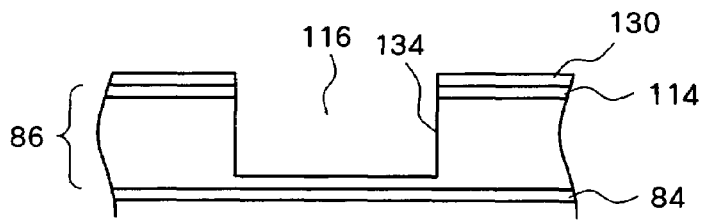

The upper structural layer stack 86 is etched using the photoresistive film 130 as an etching mask, forming the apertured part 116 at the location that corresponds to the light-receiving part 52 (FIG. 6C). The etching can be performed anisotropically using, e.g., a dry etching technique. The apertured part 116 is thereby formed in a shape surrounded from the aperture edge to the bottom surface by a side wall 134, which is formed at an angle that is approximately perpendicular.

Figure 6D:
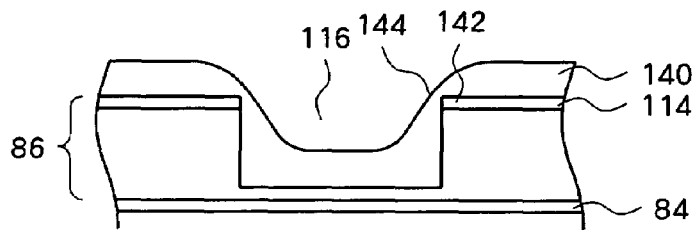

Once the etchback that forms the apertured part 116 has been completed, the photoresistive film 130 is removed. A smoothing film 140 is then applied. The smoothing film has an ability to smooth out roughness on the underlying surface (FIG. 6D). The smoothing film 140 may be formed, e.g., by spin coating an antireflective film XHRiC (Nissan Chemical Industries, Ltd.) or other material for use in semiconductor lithography.

The smoothing film 140 smoothly covers corner parts 142 on the aperture edge of the apertured part 116. Specifically, the smoothing film 140 bends more gently than the corner parts 142, which bend at a sharp angle that is approximately perpendicular, and forms a flared surface 144 from the inside of the apertured part 116 to the outer side of the aperture edge. As result, the smoothing film 140 that covers the corner parts 142 is thinner than the smoothing film 140 deposited on the upper structural layer stack 86 in locations away from the outer side of the aperture edge, and thinner than the smoothing film 140 deposited on the bottom surface of the apertured part 116 in locations away from the inner side of the aperture edge.

Etching then proceeds from the surface of the smoothing film 140. The method and conditions of etching are set so that the etching of the smoothing film 140 on the aperture edge is completed and the etching then continues to the corner parts 142 before the relatively thickly deposited smoothing film 140 is completely removed by etching in locations other than aperture edge. The etching methods and the like are therefore established so that, e.g., the smoothing film 140 and the silicon-nitride film 114 and the silicon-oxide film 112 that appear from beneath the smoothing film 140 can be eroded at approximately equal etching rates.

Figure 6E:
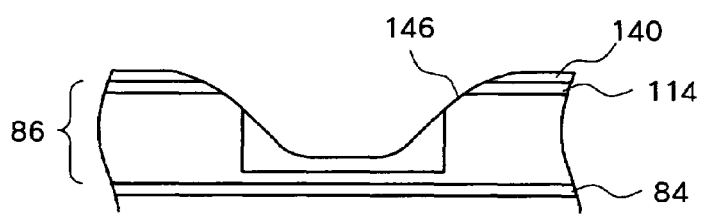

The corner parts 142 of the upper structural layer stack 86 are removed by the etching, and a removed surface 146 is formed (FIG. 6E). The etching rate is established to be approximately equal for the smoothing film 140, the silicon-nitride film 114, and the silicon-oxide film 112, for example, and the aforementioned etching is carried out, whereby the flared shape of the surface 144 of the smoothing film 140 on the aperture edge is transferred to the removed surface 146, allowing the flared surface 120 shown in FIG. 5 to be formed.

Figure 7A:
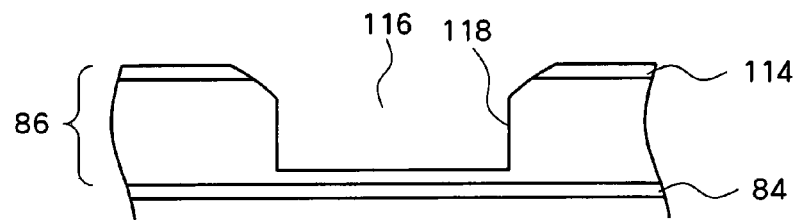
FIGS. 7A through 7D are schematic drawings showing cross-sectional structures during the major steps for manufacturing the light detector of an embodiment of the present invention.

Once the corner parts 142 have been removed, the etching is stopped and the smoothing film 140 remaining at that point is selectively removed using other methods. For example, the smoothing film 140 is detached and removed from the upper surface of the upper structural layer stack 86 and the inside of the apertured part 116 by dry etching (FIG. 7A).

Figure 7B:
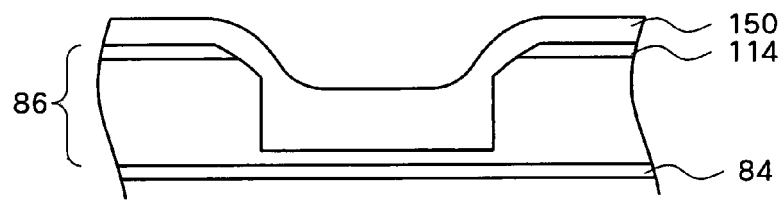

The apertured part 116 is thus formed on the upper structural layer stack 86 having an enlarged aperture edge. A polyimide is applied to the surface of the upper structural layer stack 86 by spin coating, forming a polyimide film 150 that acts as a surface-covering film (FIG. 7B). The non-photosensitive polyimide PIX/PIQ series (HD Microsystems, L.L.C.) or the like may be used as the applied polyimide.

After the aperture edge has been enlarged, the height of the side wall 118 of the apertured part 116 is lower than the height of the pre-enlargement side wall 134. The enlargement of the aperture edge and the reduction in the height of the side wall have the result of efficaciously reducing the aspect ratio of the apertured part 116. The polyimide film 150 therefore tends not to accumulate in the apertured part 116, and differences in the thickness of the polyimide film 150 outside and inside the apertured part 116 can be diminished.

Figure 7C:
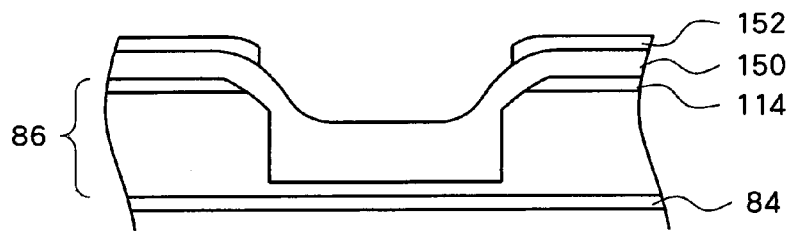

A photoresistive film is applied/formed on the polyimide film 150. This photoresistive film is patterned using photolithography, forming a photoresistive film 152 that covers the silicon-nitride film 114 on the surface of the upper structural layer stack 86 and that forms an aperture in the region that corresponds to the light-receiving part 52 (FIG. 7C).

Figure 7D:
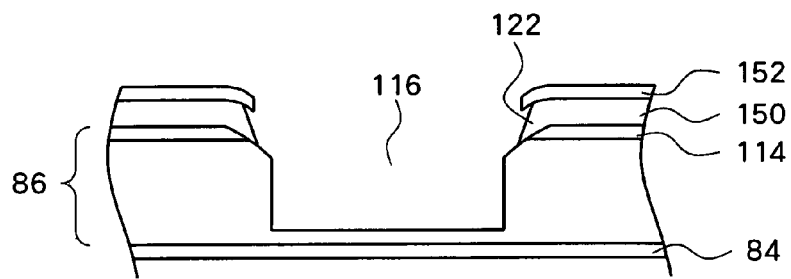

The polyimide film 150 is then etched by wet etching using the photoresistive film 152 as an etching mask. The polyimide film 150 is thereby removed from within the apertured part 116, and a polyimide film 122 is formed that covers the silicon-nitride film 114 (FIG. 7D). The photoresistive film 152 is then removed, whereby the structure shown in FIG. 5 is obtained.

The thickness of the polyimide film 150 within the apertured part 116 can be reduced to approximately the thickness of the polyimide film 150 on the upper surface of the upper structural layer stack 86. The polyimide film 150 can therefore be properly removed from within the apertured part 116 during etching, and the formation of residues and striations as well as other problems tend not to occur. The polyimide film is uniformly removed from the bottom surface of the apertured part 116, whereby the transmittance of light incident on the PDs 56 positioned on the light-receiving part 52 is equalized, and the accuracy of light detection by the PDs 56 is improved.

In the aforedescribed manufacturing method, the limits of the enlargement of the aperture edge are set based on the limits of the taper of the surface of the smoothing film at the corner parts of the initial aperture edge, or, in other words, based on the limits of the expansion of the flare shape. In other words, the shape of the enlarged aperture edge is established to be self-aligned based on the shape of the initial aperture edge. A separate etching mask and the alignment thereof are thus unnecessary, and therefore the working precision can be maintained using simple processes.

When the etching rates of the smoothing film 140 and the upper structural layer stack 86 are established to be approximately equal as described above in the etching treatment for removing the corner parts 142, the removed surface 146 can be formed having a smoothly flared shape transferred from the smoothing film 140. On the other hand, when differences arise between the etching rates of the smoothing film 140 and the silicon-nitride film 114 and the silicon-oxide film 112 that appear from beneath the smoothing film 140, the surface shape of the smoothing film will not necessarily be properly transferred to the removed surface 146. Even in this case, however, the apertured part can be enlarged, the polyimide film 150 can be prevented from remaining too thick within the apertured part 116, and the polyimide film 150 can be properly removed from within the apertured part 116 by subsequent etching.

The present invention was described above according to an embodiment related to a light detector, but applications of the present invention are not necessarily limited to cases in which light-receiving elements such as the PDs 56 are formed within a substrate. In other words, the present invention may also be applied to other integrated circuits having similar structures on the substrate.

The method for manufacturing an integrated circuit according to the present invention, as described above according to an embodiment, comprises: a step for forming an apertured part, in which an upper structural layer stack laminated on a substrate is etched to form the apertured part; a step for forming a smooth film, in which a smoothing film that decreases in thickness on a corner part of an aperture edge of the apertured part is deposited on a surface of the upper structural layer stack; a step for enlarging the aperture edge, in which the smoothing film and the upper structural layer stack are both subjected to erosive etching, the corner part that is exposed from the smoothing film is removed, and the aperture edge is expanded; a step for detaching the smoothing film, in which the smoothing film that remains from the etching treatment in the step for enlarging the aperture edge is detached; a step for covering the surface, in which a surface-covering film is applied to the surface of the upper structural layer stack after the step for detaching the smoothing film; a step for forming an etching mask, in which an etching mask is formed on the surface-covering film; and a step for etching the surface-covering film, in which the surface-covering film is etched using the etching mask and removed from the apertured part.

The present invention may also be used when a silicon-nitride film is laminated on an upper surface of the upper structural layer stack; the surface-covering film is formed using a polyimide that has a function of relieving stress on the silicon-nitride film; and the step for etching the surface-covering film is carried out by wet etching.

The present invention may also be configured to use the smoothing film to form a flared surface that expands from an inner part of the apertured part to an outer side of the aperture edge in a location that corresponds to the corner part of the aperture edge; and, in the step for enlarging the apertured part, to form a removed surface of the corner part in a flared shape in accordance with a surface shape of the smoothing film.

The step for detaching the smoothing film in the present invention may also comprise detaching the smoothing film by dry etching.

The method for manufacturing an integrated circuit according to the present invention may also be used to manufacture an integrated circuit, whereby a light-receiving part and a circuit part are positioned adjacent to one another on a semiconductor substrate that acts as the substrate; the upper structural layer stack has a silicon-nitride film laminated on an upper surface thereof and has a metal wiring and an interlayer insulating film that constitute the circuit part; and the apertured part is provided correspondingly to the location of the light-receiving part and forms a window for incident light in the light-receiving part.

According to the present invention, there is used a smoothing film surface shape having reduced thickness at the corners of the aperture edge, and the corner parts of the apertured part are removed, whereby the surface-covering film tends not to accumulate in the apertured part when the surface-covering film is applied. The surface-covering film is thereby properly etched away from the apertured part. While the surface-covering film can be properly removed from the apertured part, the thickness of the surface-covering film on the upper structural layer stack can be increased, allowing improved function of the surface-covering film in protecting the surface of the upper structural layer stack.

The invention claimed is:

1. A method for manufacturing an integrated circuit, comprising:

a step for forming an apertured part, in which an upper structural layer stack laminated on a substrate is etched to form the apertured part;

a step for forming a smooth film, in which a smoothing film that decreases in thickness on a corner part of an aperture edge of the apertured part is deposited on a surface of the upper structural layer stack;

a step for enlarging the aperture edge, in which the smoothing film and the upper structural layer stack are both subjected to erosive etching, the corner part that is exposed from the smoothing film is removed, and the aperture edge is expanded;

a step for detaching the smoothing film, in which the smoothing film that remains from the etching treatment in the step for enlarging the aperture edge is detached;

a step for covering the surface, in which a surface-covering film is applied to the surface of the upper structural layer stack after the step for detaching the smoothing film;

a step for forming an etching mask, in which an etching mask is formed on the surface-covering film; and a step for etching the surface-covering film, in which the surface-covering film is etched using the etching mask and removed from the apertured part.

2. The method for manufacturing an integrated circuit according to claim 1, comprising:

providing a silicon-nitride film layered on an upper surface of the upper structural layer stack;

forming the surface-covering film using a polyimide that has a function of relieving stress on the silicon-nitride film; and carrying out the step for etching the surface-covering film by wet etching.

3. The method for manufacturing an integrated circuit according to claim 1, comprising:

forming the smoothing film to have a flared surface that expands from an inner part of the apertured part to an outer side of the aperture edge in a location that corresponds to the corner part of the aperture edge; and forming a removed surface of the corner part in a flared shape in accordance with a surface shape of the smoothing film in the step for enlarging the apertured part.

4. The method for manufacturing an integrated circuit according to claim 1, comprising:

detaching the smoothing film by dry etching in the step for detaching the smoothing film.

5. The method for manufacturing an integrated circuit according to claim 1, comprising:

establishing an etching rate of the smoothing film to be the same as the upper structural layer stack during the etching treatment in the step for enlarging the aperture edge.

6. The method for manufacturing an integrated circuit according to claim 1, comprising:

manufacturing an integrated circuit that has a light-receiving part and a circuit part positioned adjacent to one another on a semiconductor substrate that acts as the substrate, wherein the upper structural layer stack has a silicon-nitride-film laminated on an upper surface thereof and has a metal wiring and an interlayer insulating film that constitute the circuit part; and the apertured part is provided correspondingly with the location of the light-receiving part and forms a window for incident light in the light-receiving part.

* * * * *